(12) United States Patent
Ko et al.

(10) Patent No.: US 10,983,430 B2
(45) Date of Patent: Apr. 20, 2021

(54) MASK ASSEMBLY AND HAZE ACCELERATION METHOD

(71) Applicant: TAIWAN SEMICONDUCTOR MANUFACTURING COMPANY, LTD., Hsinchu (TW)

(72) Inventors: Wu-Hung Ko, Tainan (TW); Chih-Wei Wen, Tainan (TW); Kun-Lung Hsieh, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 156 days.

(21) Appl. No.: 15/902,903

(22) Filed: Feb. 22, 2018

(65) Prior Publication Data
US 2019/0258155 A1 Aug. 22, 2019

(51) Int. Cl.
| | | |
|---|---|---|
| *G03F 1/44* | (2012.01) |
| *G03F 1/54* | (2012.01) |
| *G03F 1/46* | (2012.01) |
| *G03F 1/62* | (2012.01) |
| *G03F 1/32* | (2012.01) |
| *G03F 1/84* | (2012.01) |

(Continued)

(52) U.S. Cl.
CPC .................. *G03F 1/44* (2013.01); *G03F 1/32* (2013.01); *G03F 1/46* (2013.01); *G03F 1/54* (2013.01); *G03F 1/62* (2013.01); *G03F 1/64* (2013.01); *G03F 1/84* (2013.01); *G03F 7/70983* (2013.01)

(58) Field of Classification Search
CPC .......... G03F 7/70983; G03F 1/32; G03F 1/84; G03F 1/64; G03F 1/54; G03F 1/46; G03F 1/62; G03F 1/44; G03F 7/20
See application file for complete search history.

(56) References Cited

U.S. PATENT DOCUMENTS 6,665,065 B1 * 12/2003 Phan ................. G01N 21/95692
356/237.1
6,803,158 B1 * 10/2004 Gordon ..................... G03F 1/32
430/323

(Continued)

FOREIGN PATENT DOCUMENTS

| JP | 05-107745 | * | 4/1993 | ............... G03F 1/14 |
| JP | 2004-109592 | * | 8/2004 | |

(Continued)

OTHER PUBLICATIONS

Vig, "Ultraviolet-ozone cleaning of semiconductor substrates" Research and Development Technical report SLCET-TR-91-93, 40 pages (Jan. 1992).*

(Continued)

*Primary Examiner* — Martin J Angebranndt
(74) *Attorney, Agent, or Firm* — Hauptman Ham, LLP

(57) ABSTRACT

A method of testing a photomask assembly is disclosed. The method includes placing a photomask assembly into a chamber. The photomask assembly includes a pellicle attached to a first side of a photomask. The method further includes exposing the photomask assembly to a radiation source in the chamber. The exposing of the photomask assembly includes illuminating an entirety of an area of the photomask covered by the pellicle throughout an entire illumination time.

17 Claims, 18 Drawing Sheets

(51) Int. Cl.
*G03F 1/64* (2012.01)
*G03F 7/20* (2006.01)

(56) References Cited

U.S. PATENT DOCUMENTS

| | | | |
|---|---|---|---|
| 8,657,966 B2* | 2/2014 | Kalyankar | B08B 3/10 134/26 |
| 2002/0076654 A1* | 6/2002 | Hasegawa | B82Y 10/00 430/311 |
| 2002/0179852 A1* | 12/2002 | Zheng | G03F 7/70925 250/492.1 |
| 2004/0200572 A1* | 10/2004 | Tejnil | B29C 65/14 156/345.1 |
| 2005/0238964 A1* | 10/2005 | Chu | G03F 1/40 430/5 |
| 2006/0158642 A1* | 7/2006 | Tanaka | G01N 21/956 356/237.5 |
| 2007/0012336 A1* | 1/2007 | Su | B08B 3/08 134/1 |
| 2009/0258159 A1* | 10/2009 | Su | G03F 1/82 427/534 |
| 2010/0111402 A1* | 5/2010 | Lee | G03F 1/84 382/145 |
| 2010/0167185 A1* | 7/2010 | Suzuki | G03F 1/32 430/5 |
| 2010/0279212 A1* | 11/2010 | Shirasaki | G03F 1/64 430/5 |
| 2011/0101226 A1* | 5/2011 | Ben-Zvi | G01N 21/958 250/358.1 |
| 2011/0286658 A1* | 11/2011 | Mitsui | G06T 7/001 382/149 |
| 2013/0108948 A1* | 5/2013 | Hu | G03F 1/38 430/5 |
| 2014/0246045 A1* | 9/2014 | Ko | G03F 7/70925 134/1 |

FOREIGN PATENT DOCUMENTS

| | | | | |
|---|---|---|---|---|
| KR | 200800627847 | * | 7/2008 | |
| KR | 2011028983 | * | 3/2011 | H01L 21/027 |
| KR | 2011114299 | * | 10/2011 | H01L 21/027 |
| KR | 2013006739 | * | 1/2013 | G03F 1/62 |
| WO | 2008/075841 | * | 6/2008 | H01L 21/027 |
| WO | 2017/008987 | * | 1/2017 | H01J 61/52 |

OTHER PUBLICATIONS

Grenon et al., "Tracking down causes of DUV sub-pellicle defects" Sol. Stat. Technol., vol. 43(6) pp. 159-170 (Jun. 2000).*
Machine translation of JP 2004-109592 (2004).*
Machine translation of KR 200800627847 (2008).*

* cited by examiner

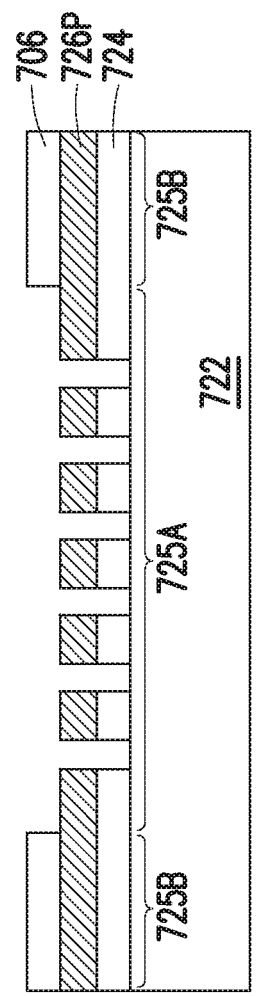

MASK ASSEMBLY AND HAZE ACCELERATION METHOD

BACKGROUND

In semiconductor technologies, masks (photomasks or reticles) include predesigned integrated circuit (IC) patterns. The masks are used to transfer predesigned IC patterns to wafers using photolithography processes. Any defect on the masks will be transferred to wafers.

One source of mask defects is mask haze which may be introduced during mask making, handling, or photolithography processes. Haze is a growth defect formed from outgassing of mask and pellicle materials, and from chemical residues of mask making and/or mask cleaning solutions. Haze may alter the transmission properties of the mask, causing printing errors on the wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
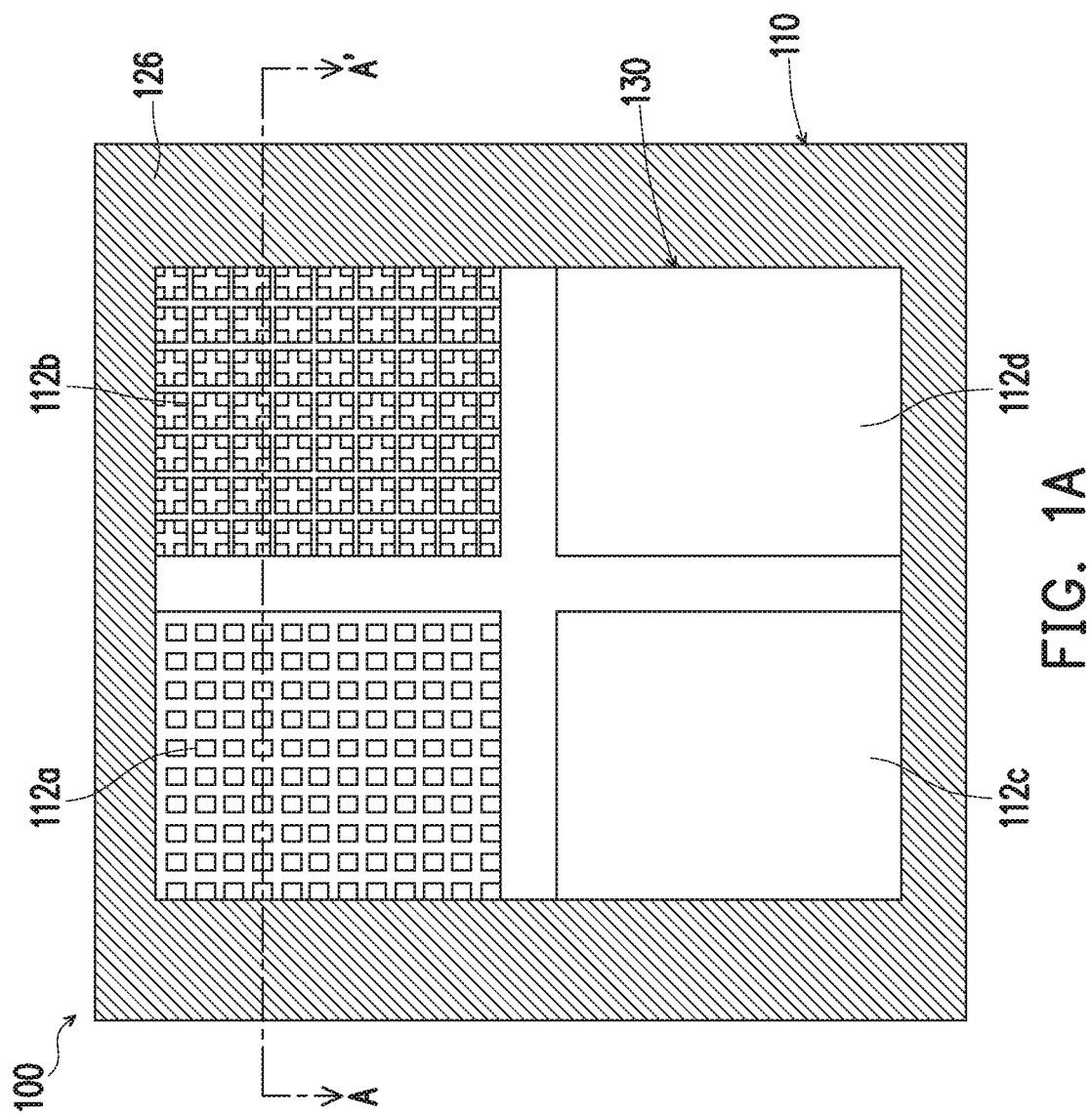
FIG. 1A is a top view of a photomask assembly in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reducing an amount of haze formation of a mask assembly helps to ensure precise transfer of a pattern on a mask to a wafer. The longer a mask assembly avoids haze formation, or has minimal haze formation, the longer a useful life of the mask assembly. The increased useful life saves time and manufacturing costs by reducing an amount of material used and down time of the production for replacing mask assemblies. Growing defect detectors (GDD) are currently used to accelerate haze formation for qualification of mask assemblies and mask cleaning processes before the mask assemblies are used for wafer processing. The use of GDDs helps to predict an expected useful life of a mask assembly. In some qualification processes, specified regions of a mask assembly are exposed to an argon fluoride (ArF) excimer laser that emits a laser beam of 193 nanometer (nm) wavelength. The high energy photons from the ArF excimer laser trigger photochemical reactions, accelerating haze formation on the mask. This haze formation acceleration process is used to evaluate suitability of materials that are employed in the mask blanks, pellicles and mask cleaning solutions. However, GDDs used with an ArF excimer laser are complicated and expensive because an expensive optical system is used for projecting the laser beam to the mask assembly. The mask assembly qualification using the ArF excimer laser is also time consuming, often requiring several days or a week for completion. Furthermore, because the ArF excimer laser only illuminates a relatively small area of the mask assembly (about 5 millimeter (mm)×5 mm), information regarding the haze formation is limited only to localized regions. The GDD using the ArF excimer laser as a radiation source thus fails to provide information for hazing across the entire mask assembly.

A process in which a higher energy radiation source illuminates a greater portion of the mask assembly helps to increase information related to formation of haze across the mask assembly and reduce the duration of the process. The increase in information helps to provide a more accurate prediction of the performance of the mask assembly during a manufacturing process. In addition, the reduced duration of the testing process helps to maximize manufacturing efficiency of the manufacturing process. In some embodiments, a vacuum ultraviolet (VUV) radiation source is used to illuminate the mask assembly in order to accelerate the haze formation.

FIG. 1A is a top view of a photomask assembly 100, in accordance with some embodiments. The photomask assembly 100 includes a photomask 110 and a pellicle 130 attached to the photomask 110. The photomask 110 includes a plurality of regions 112a-112d. Each region 112a-112d contains a pattern for transfer to a material layer of a semiconductor device, such as an integrated circuit. In some embodiments, a first region 112a has a same pattern as at least one other region 112b, 112c, 112d. In some embodiments, a first region 112a has a different pattern from at least one other region 112b, 112c, 112d. The photomask 110 includes a binary intensity mask, a phase shifting mask (PSM), an attenuated mask, a reflection mask and/or combinations thereof.

Figure 1B:
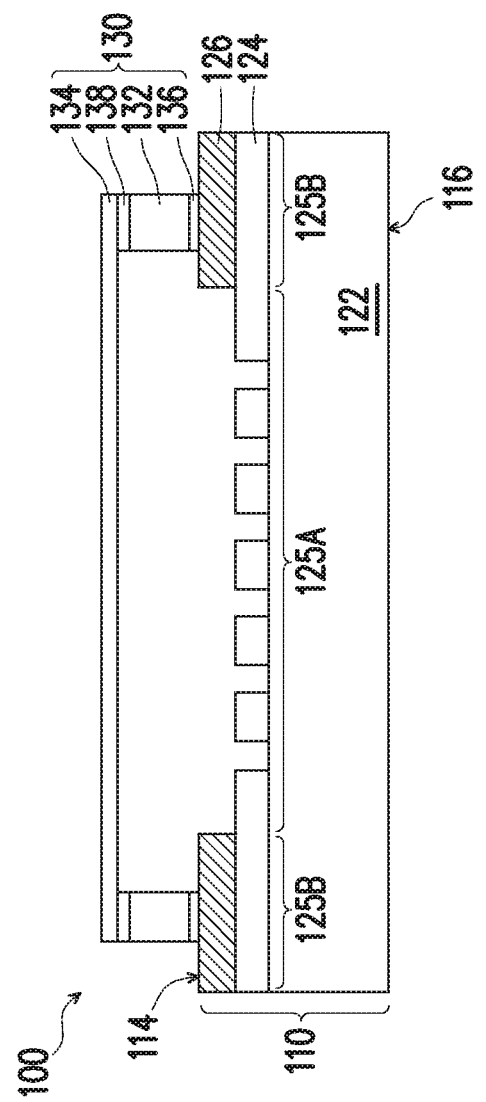
FIG. 1B is a cross-sectional view of the photomask assembly of FIG. 1A along line A-A' in accordance with some embodiments.

FIG. 1B is a cross-sectional view of the photomask assembly of FIG. 1A along line A-A', in accordance with some embodiments. The photomask 110 has a front side 114 and a back side 116 opposite the front side 114.

In FIG. 1B, the photomask 110 includes a substrate 122, a first patterned layer 124 on the substrate 122, and a second patterned layer 126 on the first patterned layer 124. In some embodiments, the first patterned layer 124 includes a pattern region 125A containing patterns corresponding to circuit patterns to be formed on a wafer and a border region 125B surrounding the pattern region 125A, and the second patterned layer 126 is on the border region 125B of the first patterned layer 124. The second patterned layer 126 is not included, in some embodiments.

In some embodiments, the substrate 122 includes a low thermal expansion (LTE) glass, fused quartz, silicon carbide, carbonado or another appropriate material. In some embodiments, the substrate 122 has a thickness ranging from about 6.3 mm to about 6.5 mm. If the thickness is too small, a risk of breakage or warping increases, in some instances. If the thickness is too great, a weight of photomask 110 is needlessly increased, in some instances.

In some embodiments, the first patterned layer 124 is configured to provide a phase shift to a radiation beam employed in a photolithography process for wafer fabrication. The first patterned layer 124 has a thickness such that the radiation beam directed toward and through the first patterned layer 124 has a phase shift relative to the radiation beam directed through air. In some embodiments, the radiation beam includes an ultraviolet (UV) beam, an ion beam, an x-ray beam, an extreme ultraviolet (EUV) beam, or a deep ultraviolet (DUV) beam. In some embodiments, the first patterned layer 124 causes a phase shift of about 180 degrees. In some embodiments, the first patterned layer 124 has a thickness about $\lambda/[2x(n-1)]$, wherein $\lambda$ is the wavelength of the radiation beam projected on the photomask 110 during a photolithography process for wafer fabrication, and n is refractive index of the first patterned layer 124 relative to the radiation beam. In some embodiments, the first patterned layer 124 provides a phase shift ranging between about 120 degrees and 240 degrees. In some embodiments, the first patterned layer 124 has a thickness ranging between $\lambda/[3x(n-1)]$ and $2\lambda/[3x(n-1)]$ to realize a desired phase shift in the above range. In some embodiments, the first patterned layer 124 includes molybdenum silicide (MoSi), tantalum disilicide (TaSi$_2$) or molybdenum silicide oxynitride (MoSiON). In one embodiment, the first patterned layer 124 includes MoSi.

In some embodiments, the first patterned layer 124 is configured to reflect light incident thereon. In some embodiments, the first patterned layer 124 has a multi-layer structure including molybdenum-silicon (Mo—Si) layer pairs. In some embodiments, the multi-layer structure has a thickness ranging from about 250 mm to about 350 nm. In some embodiments, each Mo layer has a thickness ranging from about 3 nm to about 4 nm. In some embodiments, each Si layer has a thickness ranging from about 4 nm to about 5 nm. The thickness of the multi-layer structure and each of the individual layers helps to maximize constructive interference of incident radiation. If the thickness is too great or too small, the constructive interference for a wavelength of the incident radiation is reduced, in some instances. In some embodiments, the multi-layer structure includes molybdenum/beryllium (Mo/Be) layer pairs.

The second patterned layer 126 is opaque to the radiation beam used in the photolithography process for semiconductor wafer fabrication. In some embodiments, the second patterned layer 126 has a transmissivity less than that of the first patterned layer 124. In some embodiments, the second patterned layer 126 has a substantially zero transmissivity. In some embodiments, the second patterned layer 126 has a thickness ranging from about 50 nm to about 75 nm depending on the wavelength of the incident radiation. The thickness of the second patterned layer 126 helps to prevent unwanted transmission of incident radiation. If the thickness is too small, a risk of unwanted transmission increases, in some instances. If the thickness is too great, material is wasted without a significant increase in performance, in some instances. In some embodiments, the second patterned layer 126 includes a material different from that of the first patterned layer 124. In some embodiments, the second patterned layer 126 includes chromium (Cr), cobalt (Co), molybdenum (Mo), tungsten (W), tantalum (Ta) or aluminum (Al). In one embodiment, the second patterned layer 126 includes Cr.

In instances where the photomask 110 is a reflection mask, the photomask 110 further includes a backside coating layer (not shown) on a side of the substrate 212 opposite the first patterned layer 124, a capping layer (not shown) interposed between the first patterned layer 124 and the second patterned layer 126, one or more anti-reflective coating (ARC) layers (not shown) on the second patterned layer 126 or other suitable elements (not shown), in some embodiments.

In some embodiments, the backside coating layer includes a chromium nitride ($Cr_xN_y$) layer. In some embodiments, the backside coating layer has a thickness ranging from about 70 mm to about 100 nanometer (nm). The thickness of the backside coating layer helps to ensure reflection of incident radiation. If the thickness is too small, a risk of radiation passing through the backside coating layer increases, in some instances. If the thickness is too great, material is wasted and production cost is increased without a significant increase in performance, in some instances.

In some embodiments, the capping layer includes a ruthenium (Ru) capping layer. In some embodiments, the Ru capping layer has a thickness ranging from about 2.5 nm to about 3 nm. In some embodiments, the capping layer includes a Si capping layer. In some embodiments, the Si capping layer has a thickness ranging from about 4 nm to about 4.5 nm. The thickness of the capping layer helps to extend the useful life of the multi-layer structure. If the thickness is too small, a useful life of the photomask 110 is reduced, in some instances. If the thickness is too great, material is wasted without a significant increase in performance, in some instances.

In some embodiments, the ARC layers include at least one of a TaxByOzNu layer, a HfxOy layer, a SixOyNz layer or other suitable anti-reflective materials for the wavelength of the incident radiation.

As described above, the photomask 110 includes a pattern region 125A usable to transfer patterns onto a wafer by photolithography. To achieve a high fidelity pattern transfer from the pattern region 125A to the wafer, the photolithography process should be defect free. Particles unintentionally deposited on the pattern region 125A introduce defects and result in degradation of the transferred patterns. Particles may be introduced by any of a variety of ways, such as during chemical mechanical planarization (CMP), a cleaning process, and/or during handling of the photomask 110.

The pellicle 130 is used to help prevent the particles from reaching photomask 110 and interfering with the pattern transfer. The pellicle 130 includes a pellicle frame 132 and a pellicle membrane 134. The pellicle frame 132 is attached to the front side 114 of the photomask 110 by a frame adhesive 136. The pellicle membrane 134 extends over the pattern region 125A of the first patterned layer 124 and has a periphery region attached the pellicle frame 132 by a membrane adhesive 138.

The pellicle frame 132 is configured to properly secure the pellicle membrane 134 to photomask 110. The pellicle frame 132 is a round shape, a rectangular shape, or any other suitable shape, and is mounted onto a border region of photomask 110. In some embodiments, the pellicle frame 132 is attached to the second patterned layer 126. The pellicle frame 132 includes a rigid material. In some embodiments, the pellicle frame 132 includes Al, Al-alloy, titanium (Ti), nickel (Ni), gold (Au), silver (Ag), copper (Cu), Mo, platinum (Pt), Cr, manganese (Mn), iron (Fe), Co, palladium (Pd), Ta, W, silicon, polymer, other suitable materials, and/or combinations thereof. In some embodiments, the pellicle frame 132 has a coefficient of thermal expansion (CTE) similar to that of the photomask 110 in order to reduce stress exerted on the photomask 110 resulting from changes in temperature. The pellicle frame 132 has a height selected to position the pellicle membrane 134 out of focus of incident radiation passing through the pellicle membrane 134 to the pattern region 125A. In some embodiments, the height of the pellicle frame 132 ranges from about 1 millimeter (mm) to about 10 mm. If the height is too small, a risk for imaging particles and other contaminants residing on the pellicle membrane 134 increases, in some instances. If the height is too great, a weight of pellicle 130 is needlessly increased, in some instances.

The pellicle frame 132 is attached to the front side 114 of the photomask 110 by frame adhesive 136. In some embodiments, the frame adhesive 136 includes a pressure sensitive adhesive. In some embodiments, the frame adhesive 136 includes a thermosetting adhesive material, e.g., epoxy resin, benzocyclobutene (BCB), methylsilsesqulxane (MSQ), polyimide, other thermosetting materials, and/or combinations thereof. In some embodiments, the frame adhesive 136 includes a glue or another material configured to secure pellicle frame 132 to photomask 110.

In some embodiments, the pellicle frame 132 is secured to the photomask 110 in a manner other than pellicle adhesive 136, such as at least one suction cup, a vacuum, or an electrostatic sticker. In such embodiments, the pellicle adhesive 136 is omitted.

The pellicle membrane 134 is a film stretched over the pellicle frame 132. The pellicle membrane 134 includes a material having sufficient mechanical strength to avoid warping to an extent that would negatively impact a photolithography process when attached to pellicle frame 132. In some embodiments, the pellicle membrane 134 includes one or more materials including silicon, fluoropolymer, silicon nitride, polycrystalline silicon (poly-Si), silicon carbide (SiC), Ru, a SiN/poly-Si/SiN sandwich film stack, a Si-based compound, other suitable materials, and/or a combination thereof.

Properties of pellicle membrane 134 are selected based on the photolithography process used to transfer patterns in the pattern region 125A to the wafer. In some embodiments, the pellicle membrane 134 has a thickness less than about 100 nm. In some embodiments, the pellicle membrane 134 has a thickness less than about 50 nm. If a thickness of the pellicle membrane is too great, a risk of absorbing incident radiation during the photolithography process increases, in some instances. In some embodiments, the pellicle membrane 134 includes multiple layers. For example, in some embodiments, the pellicle membrane 134 includes a first sublayer of SiN having a thickness that is less than about 10 nm; a second sublayer of poly-Si having a thickness that is less than about 100 nm; and a third sublayer of SiN having a thickness that is less than about 10 nm.

In some embodiments, the pellicle membrane 134 has a total thickness variation (TTV) less than about 10 nm. The TTV is a measure of uniformity of pellicle membrane 134. As TTV increases, differences between a quality of transfer of one portion of pattern region 125A to the wafer and another portion of pattern region 125A to the wafer increases, in some instances. In some embodiments, surfaces of the pellicle membrane 134 have a root mean squared (RMS) roughness that is less than about 10 nm. The RMS roughness impacts diffusion of radiation passing through the pellicle membrane 134. As the RMS roughness increases, diffusion of radiation passing through the pellicle membrane 134 increases resulting in reduced quality of pattern transfer, in some instances.

The pellicle membrane 134 is attached to the pellicle frame 132 by membrane adhesive 138. In some embodiments, the membrane adhesive 138 includes a thermosetting adhesive material such as, for example, epoxy resin, acrylic resin, fluorine resin, BCB, MSQ, polyimide, other thermosetting materials, and/or combinations thereof. In some embodiments, the membrane adhesive 138 includes a glue or another material configured to secure pellicle membrane 134 to pellicle frame 132. In some embodiments, the membrane adhesive 138 has a same material as the frame adhesive 136. In some embodiments, the membrane adhesive 138 has a different material from the frame adhesive 136.

Figure 2:
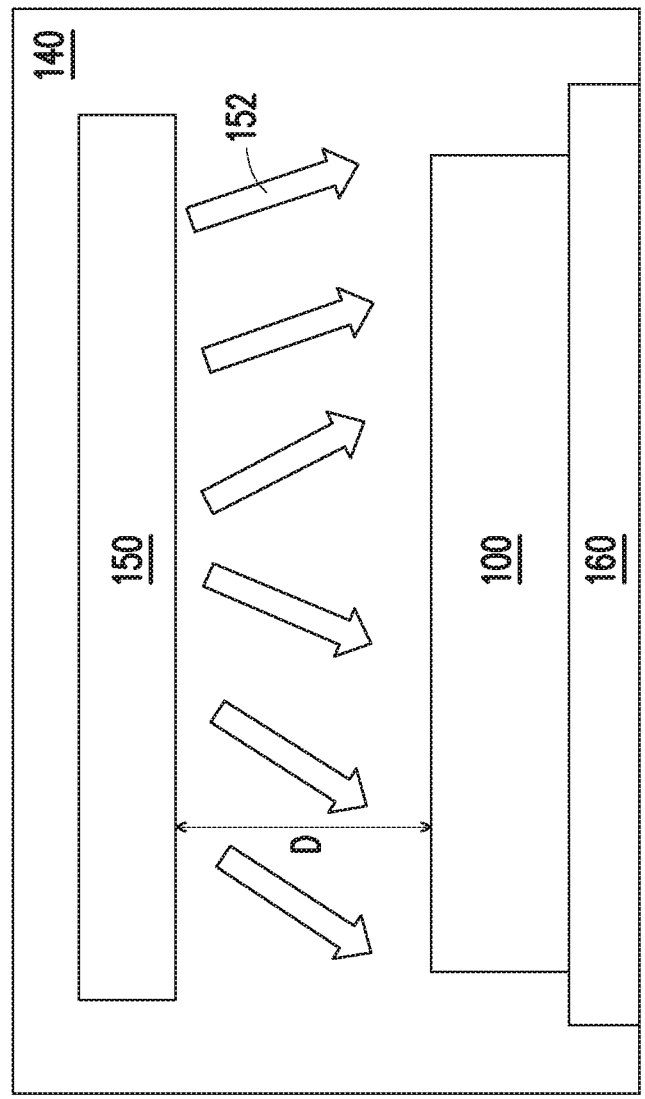
FIG. 2 is a cross-sectional view of a chamber for acceleration of haze formation in accordance with some embodiments.

FIG. 2 is a cross-sectional view of a chamber 140 for exposing the photomask assembly 100 to radiation for haze formation, in accordance with some embodiments. The chamber 140 includes a radiation source 150 operative to illuminate at least the pellicle-containing portion of the photomask assembly 100 with radiation 152 during an entire time of the haze generation process. That is, the illumination range of the radiation source 150 covers the pellicle 130 and at least pattern region 125A. In some embodiments, the illumination range of the radiation source 150 covers an entire photomask assembly 100 such that the pellicle 130 and the entire photomask 110 are illuminated. The broader illumination provided by the radiation source 150 allows generating haze from a much wider area (e.g. at least the area of the pellicle) in comparison with the localized illumination area provided by an ArF excimer laser (e.g., 5 mm×5 mm). As a result, more comprehensive information as to the haze formation on photomask 110 is obtained from a single illumination process. In some embodiments, the radiation source 150 directly illuminates the photomask assembly 100 without an optical system for projecting radiation 152 from radiation source 150 to photomask assembly 100. Eliminating the optical system greatly reduces the complexity of the tools for testing the mask assembly and cost of GDDs.

The radiation source 150 is a VUV radiation source that emits radiation 152 having a wavelength ranging from about 160 nm to about 180 nm. In some embodiments, the radiation source 150 includes a plurality of noble gas or noble gas hydride compound lamps having a wavelength of 172 nm. Because the radiation of the radiation source 150 is shorter in wavelength as compared with the ArF excimer laser radiation (193 nm in wavelength), the higher photon energy of the radiation source 150 allows generating haze more rapidly, which in turn leads to a significant reduction of the haze generation time. For example, the haze is detected within 10 minutes (mins) after exposing the photomask assembly 100 to a VUV radiation source having a wavelength of 172 nm, in some embodiments. In contrast, the ArF excimer laser process has a duration of several days to a week.

The chamber 140 also includes a support 160 for supporting the photomask assembly 100 in a position to receive the radiation 152. The support 160 is operative to adjust the distance between the radiation source 150 and the photomask assembly 100. The distance D between the radiation source 150 and the photomask assembly 100 ranges from about 0.1 centimeter (cm) to about 30 cm, in some embodiments. If the distance D is too small, the radiation intensity is too strong, increasing a risk of damaging pellicle 130, in some instances. If the distance D is too large, the radiation intensity is too weak, increasing the duration of the testing process and causing a low haze generation efficiency, in some instances.

Figure 3A:
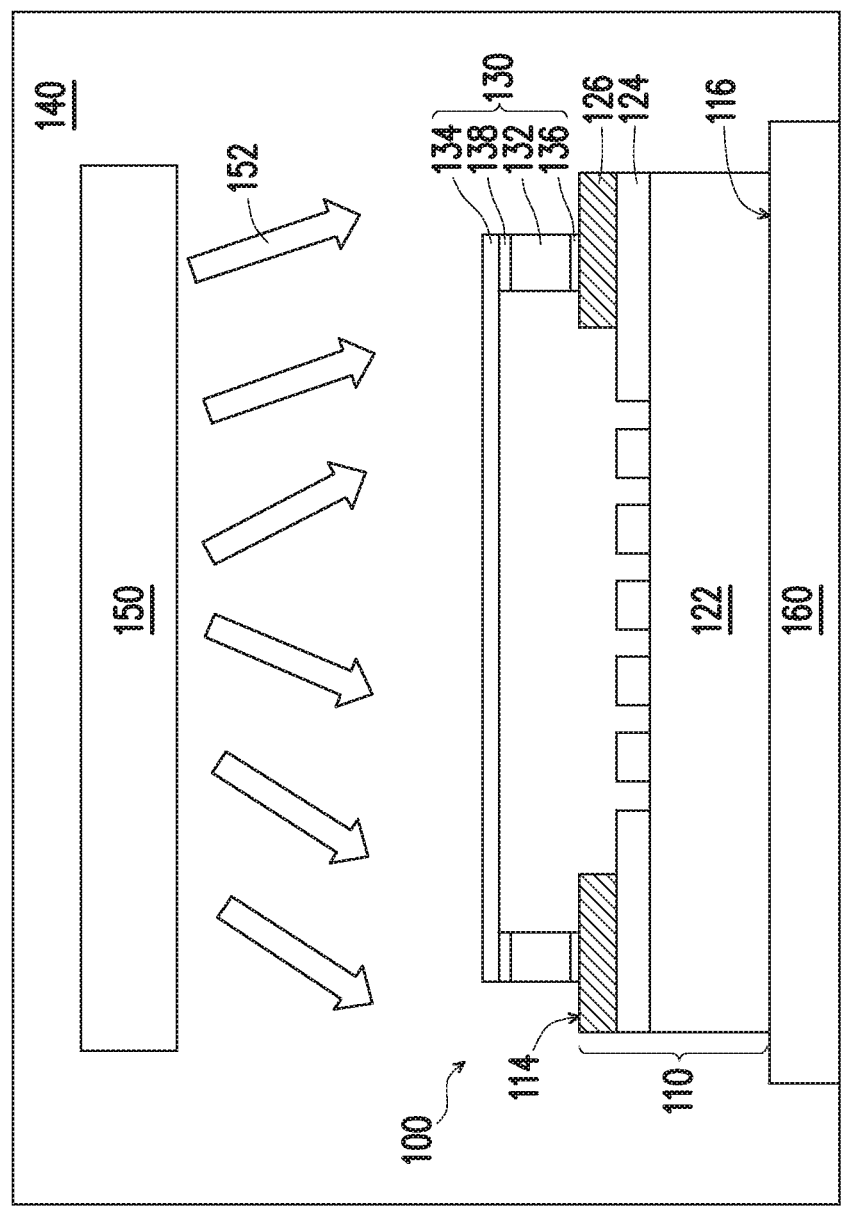
FIGS. 3A and 3B are cross-sectional views of an exposure process for a photomask assembly for haze formation in accordance with some embodiments.
Figure 3B:
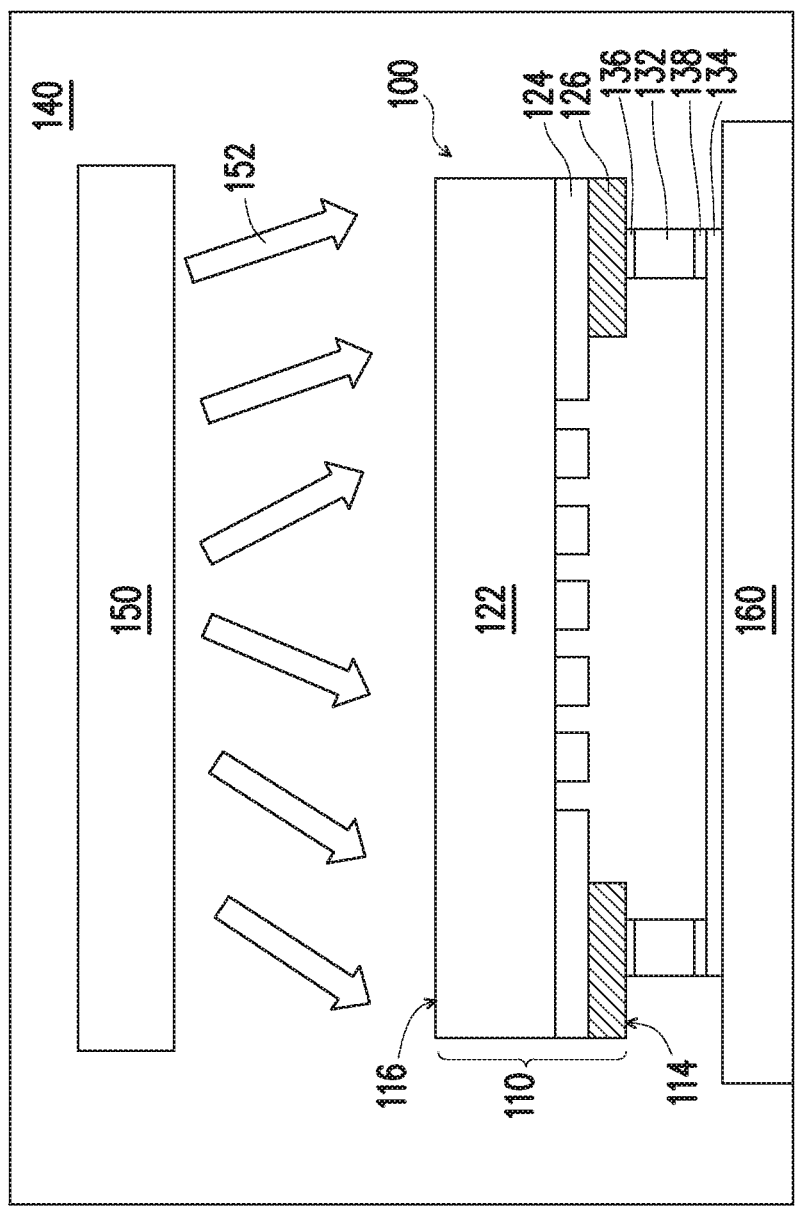

Referring to FIGS. 3A and 3B, the photomask assembly 100 is placed in the chamber 140 and is illuminated by the radiation source 150 from front side 114 of the photomask 110 (in FIG. 3A) and back side 116 of the photomask 110 (in FIG. 3B), respectively, to accelerate the generation of haze on the surface of the photomask 110. Referring to FIG. 3A, the photomask assembly 100 is placed with the back side 116 of the photomask 110 towards the support 160 so that the front side 114 of the photomask 110 receives the incident radiation 152. Referring to FIG. 3B, the photomask assembly 100 is placed with the front side 114 of the photomask 110 towards the support 160 so that the back side 116 of the photomask 110 receives the incident radiation 152. The vacuum level or pressure level in the chamber 140 during the radiation 152 exposure is from about 0.1 atmosphere (atm) to about 1 atm, in some embodiments. If the pressure in the chamber is too high, contaminants in the chamber reduces the intensity of emitted radiation incident on the mask assembly, in some instances. If the pressure in the chamber is too low, the operation cost increases without significant increase in performance, in some instances.

After exposure, the photomask assembly 100 is removed from the chamber 140. A mask defect inspection process is performed to detect the haze formation on the photomask 110. For example, an optical inspection tool is utilized to scan an entire surface of the photomask 110 to detect for contaminants or precipitates on the photomask 110.

Figure 4A:
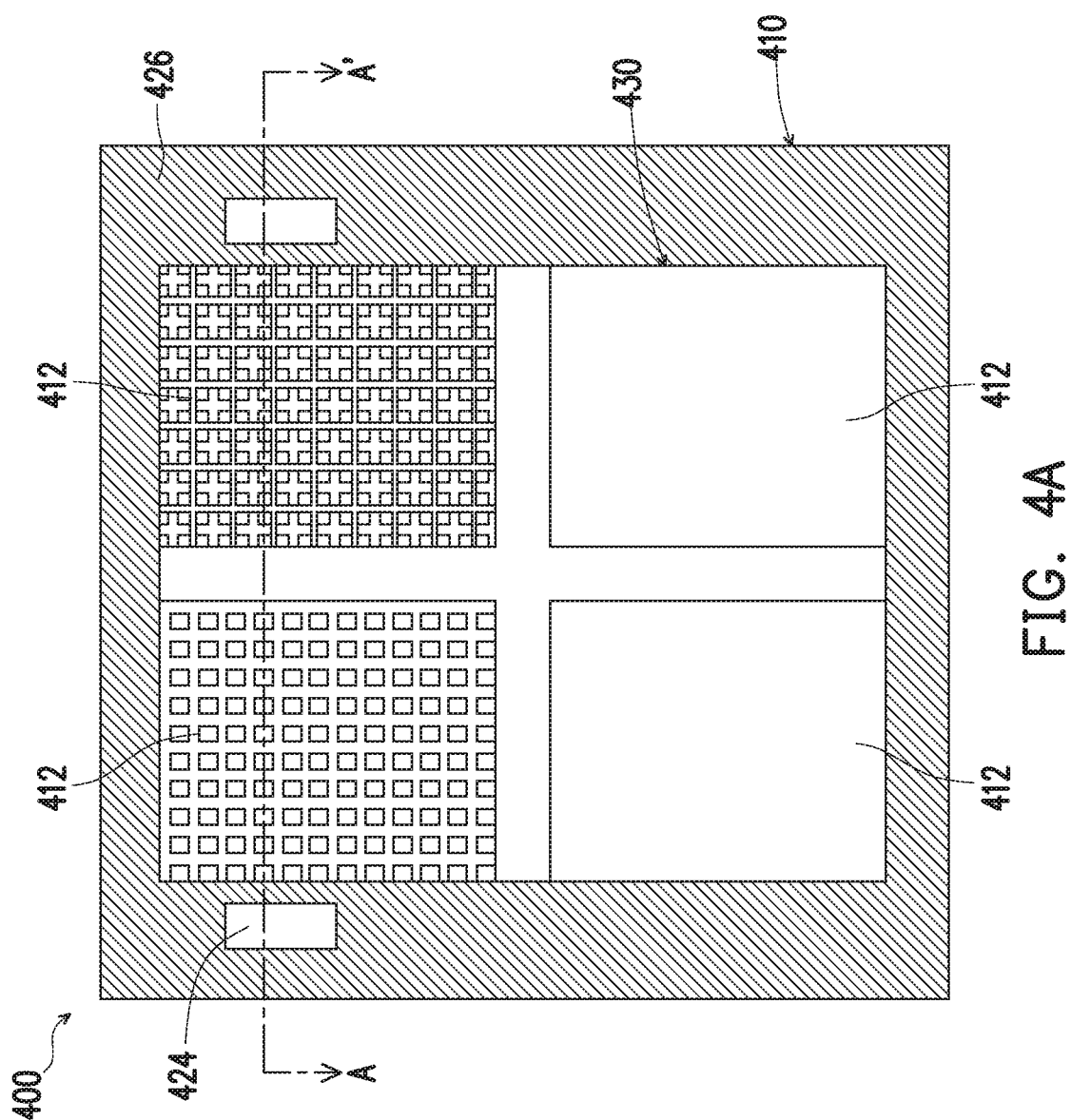
FIG. 4A is a top view of a photomask assembly in accordance with some embodiments.
Figure 4B:
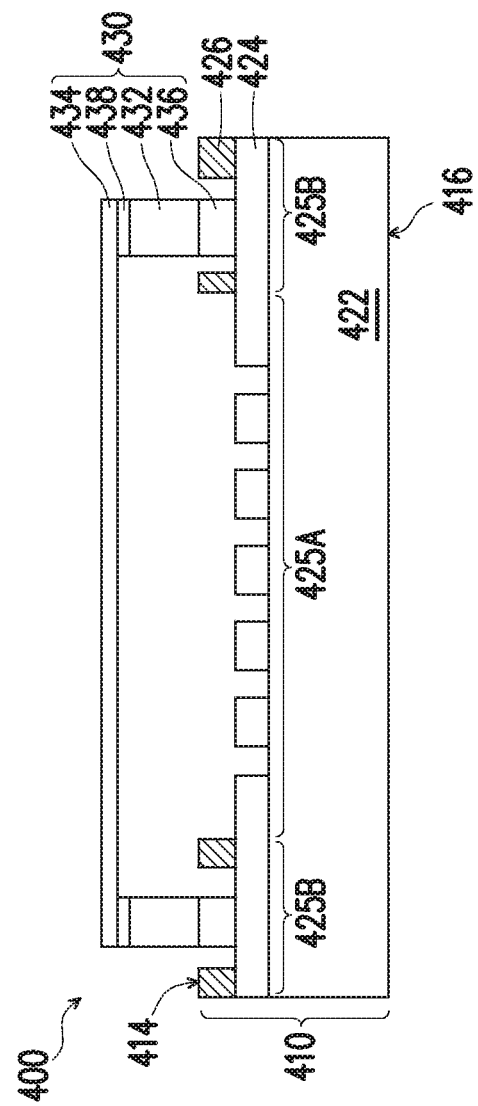
FIG. 4B is a cross-sectional view of the photomask assembly of FIG. 4A along line A-A' in accordance with some embodiments.

FIG. 4A is a top view of a photomask assembly 400, in accordance with some embodiments. FIG. 4B is a cross-sectional view of the photomask assembly 400 of FIG. 4A along line A-A' in accordance with some embodiments. Items of FIGS. 4A and 4B that are the same as or similar to items in FIGS. 1A and 1B are indicated by the same reference numerals, increased by 300. The mask assembly 400 is similar to the photomask assembly 100 of FIGS. 1A and 1B, except that in the photomask assembly 400, the second patterned layer 426 underneath the pellicle frame 432 is partially removed to allow exposure of the frame adhesive 436 to the radiation 152 during the haze acceleration process.

Referring to FIGS. 4A and 4B, the photomask assembly 400 includes a photomask 410 having a plurality of regions 412 formed thereon and a pellicle 430 attached to a front side 414 of the photomask 410 at a border region of the photomask 410 surrounding regions 412. The photomasks 410 includes a substrate 422, a first patterned layer 424 on the substrate 422 and a second patterned layer 426 on the second pattern layer 424. The first patterned layer 424 includes a pattern region 425A and a border region 425B surrounding the pattern region 425A and the second patterned layer 426 is formed on the border region 425B of the first patterned layer 424. In some embodiments and as shown, a portion of the second patterned layer 426 overlying the border region 425B of the first patterned layer 424 is partially removed to expose portions of the first patterned layer 424 in the border region 425B over which the pellicle 430 is subsequently mounted. In some embodiments, the removal of the second patterned layer 426 from a portion of the border region 425B of the first patterned layer 424 is performed at the same time as the formation of the second patterned layer 426, thus no additional processing steps are used to expose the border region 425B of the first patterned layer 424. The pellicle 430 includes a pellicle frame 432 and a pellicle membrane 434. A first portion of the pellicle frame 432 is attached to the exposed portions of the first patterned layer 424 and a second portion of the pellicle frame is attached to the second patterned layer 426 by a frame adhesive 436. The pellicle membrane 434 extends across the pellicle frame 432 and is secured to the pellicle frame 432 by a membrane adhesive 438.

The photomask assembly 400 is placed in the chamber 140 of FIG. 2 and a haze acceleration process described above in FIGS. 3A and 3B is performed to illuminate the entire photomask assembly 400 from front side 414 of the photomask 410 and back side 416 of the photomask 410 using the radiation source 150. After exposure, the photomask assembly 400 is removed from the chamber 140. A mask defect inspection process is performed to detect the haze formation on the photomask 410. For example, an optical inspection tool is utilized to scan an entire surface of the photomask 410 to detect for contaminants or precipitates on the photomask 410.

Because the first patterned layer 424 allows some illumination light to pass through, when illuminated from the back side 416 of the photomask 410, portions of the frame adhesive 436 that are in direct contact with the border region 425B of the first patterned layer 424 are exposed to the radiation 152. The outgassing characteristics of the frame adhesive 436 which would otherwise not be obtained when the border region 425B of the first patterned layer 424 is completely blocked by the second patterned layer 426 is thus obtained using the mask assembly 400, which helps to accurately test the mask assembly 400.

The extent of removal of the second patterned layer 426 is used to control the exposure area of the frame adhesive, thus providing flexibility in mask design and outgassing verification. The larger exposure area allows a more precise evaluation of hazing of the frame adhesive, in comparison with some embodiments of the current approach.

Figure 5A:
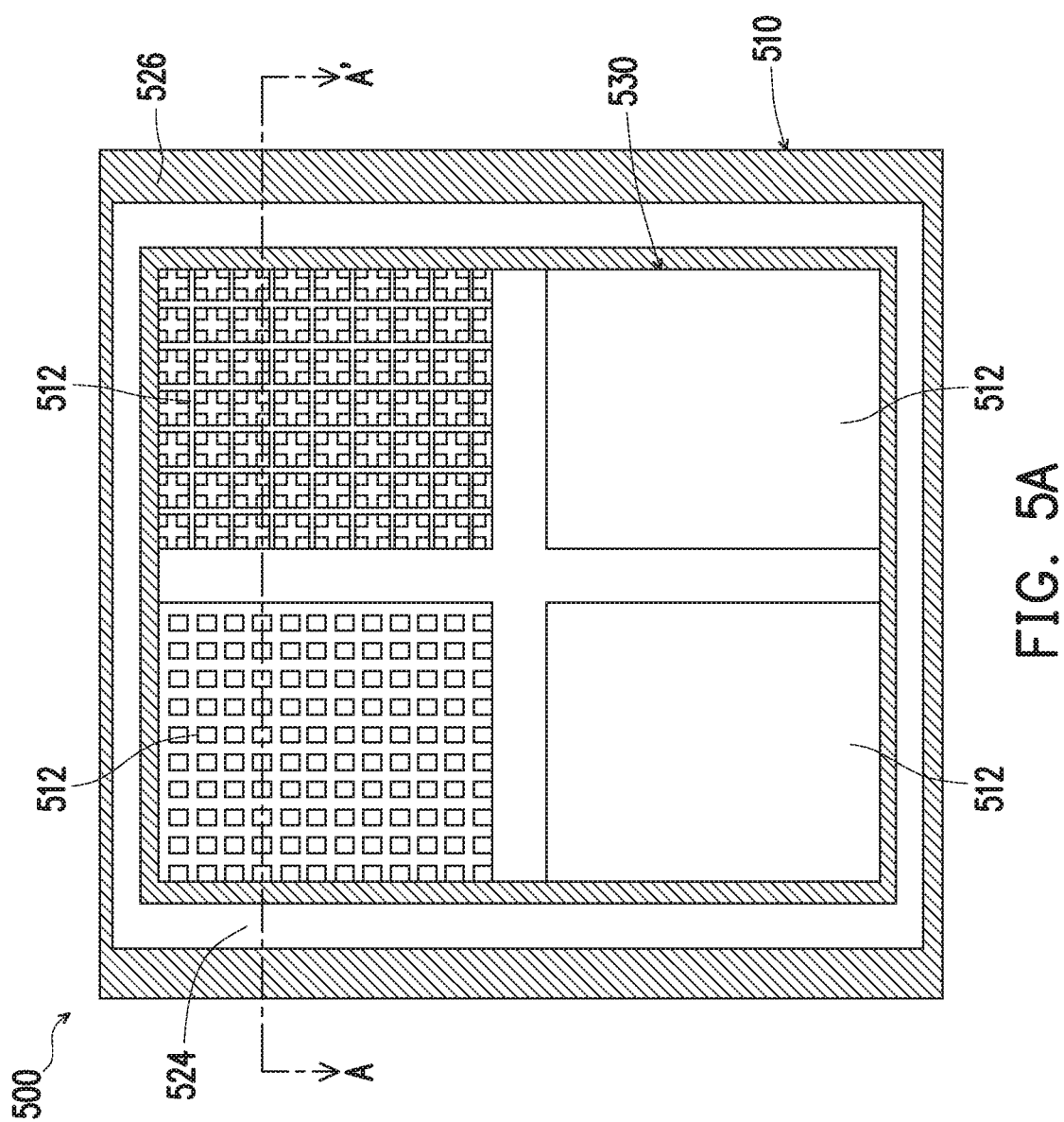
FIG. 5A is a top view of a photomask assembly in accordance with some embodiments.
Figure 5B:
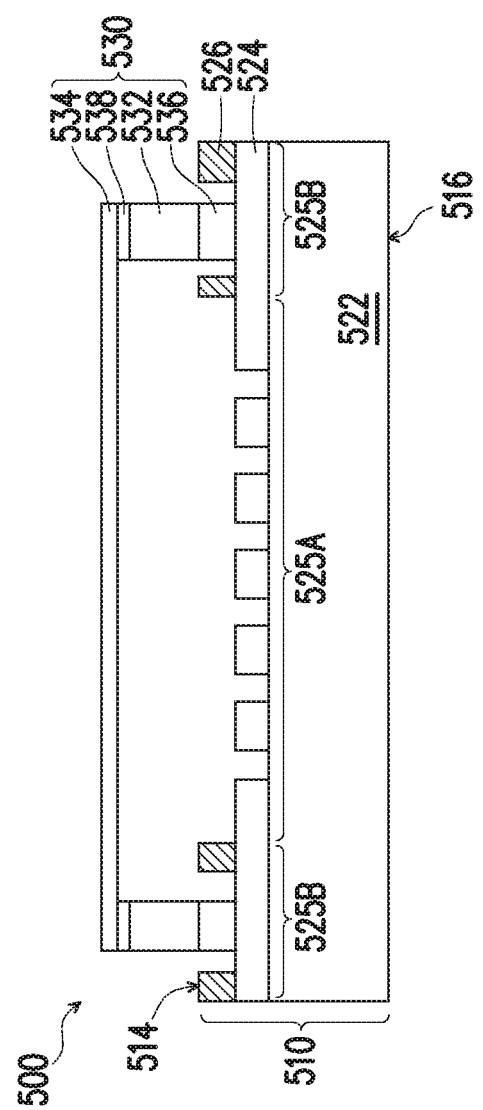
FIG. 5B is a cross-sectional view of the photomask assembly of FIG. 5A along line A-A' in accordance with some embodiments.

FIG. 5A is a top view of another photomask assembly 500, in accordance with some embodiments. FIG. 5B is a cross-sectional view of the photomask assembly 500 of FIG.

5A along line A-A'. Items of FIGS. 5A and 5B that are the same as or similar to items in FIGS. 4A and 4B are indicated by the same reference numerals, increased by 100. The mask assembly 500 is similar to the photomask assembly 400 of FIGS. 4A and 4B, except that in the photomask assembly 500, the second patterned layer 526 underneath the pellicle frame 532 is completely removed to allow full exposure of the frame adhesive 536 to the radiation 152 during the haze acceleration process.

Referring to FIGS. 5A and 5B, the photomask assembly 500 includes a photomask 510 having a plurality of regions 512 formed thereon and a pellicle 530 attached to a front side 514 of the photomask 510 surrounding regions 512. The photomasks 510 includes a substrate 522, a first patterned layer 524 on the substrate 522 and a second patterned layer 526 on the first patterned layer 524. The first patterned layer 524 includes a pattern region 525A and a border region 525B surrounding the pattern region 525A and the second patterned layer 526 is formed on the border region 525B of the first patterned layer 524. In some embodiments and as shown, a portion of the second patterned layer 526 overlying the border region 525B of the first patterned layer 524 is completely removed, exposing an entire portion of the first patterned layer over which the pellicle 530 is subsequently mounted. As described above with respect to photomask assembly 400, in some embodiments, the removal of the second patterned layer 526 from a portion of the border region 525B of the first patterned layer 524 is performed at the same time as the formation of the second patterned layer 526, thus no additional processing steps are used to expose the border region 525B of the first patterned layer 524. The pellicle 530 includes a pellicle frame 532 and a pellicle membrane 534. An entirety of the pellicle frame 532 is attached to the exposed portion of the first patterned layer 524 by a frame adhesive 536. The pellicle membrane 534 extends across the pellicle frame 532 and is secured to the pellicle from 532 by a membrane adhesive 538.

The photomask assembly 500 is placed in the chamber 140 of FIG. 2 and a haze acceleration process described above in FIGS. 3A and 3B is performed to directly illuminate the photomask assembly 500 from a front side 514 of the photomask 510 and a back side of the photomask 510, using the radiation source 150. The entire frame adhesive 536 is in direct contact with the first patterned layer 324 and is exposed to the radiation 152 when illuminated from the back side 516 of the photomask 530 for outgassing verification. The full exposure of the frame adhesive 536 during the haze acceleration process helps to maximize the outgassing of the frame adhesive 536.

After exposure, the photomask assembly 500 is removed from the chamber 140. A mask defect inspection process is performed to detect the haze formation on the photomask 510. For example, an optical inspection tool is utilized to scan an entire surface of the photomask 510 to detect for contaminants or precipitates on the photomask 510.

Figure 6:
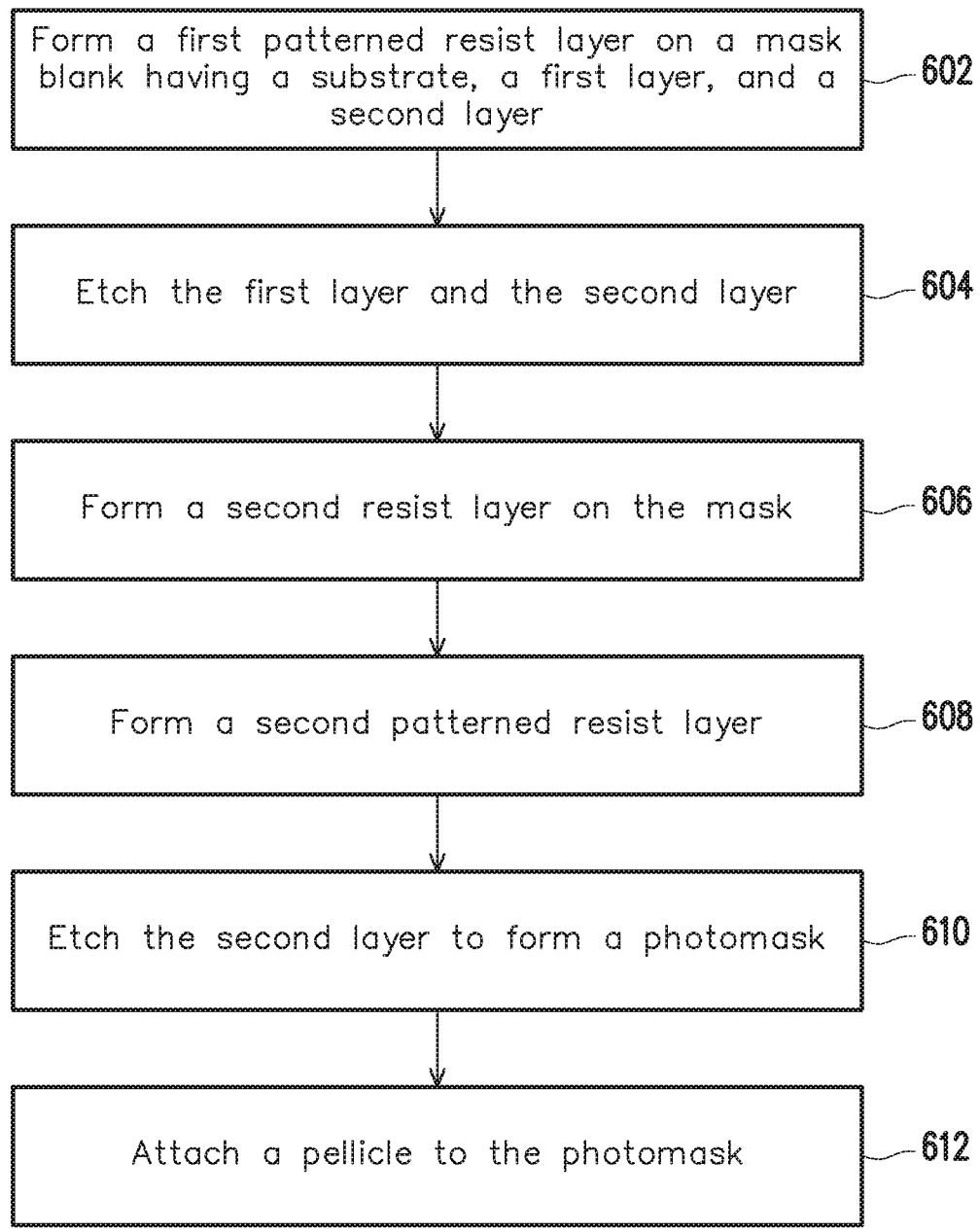
FIG. 6 is a flowchart of a method of fabricating a photomask assembly in accordance with some embodiments.

FIG. 6 is a flowchart of a method 600 of fabricating a photomask assembly in accordance with some embodiments. FIG. 7-12 are cross-sectional views of a photomask assembly at various fabrication stages fabricated using the method 600 in accordance with some embodiments. With reference to FIGS. 6 through 12, the method 600 and the photomask assembly 700 fabricated thereby are collectively described below.

Figure 7:
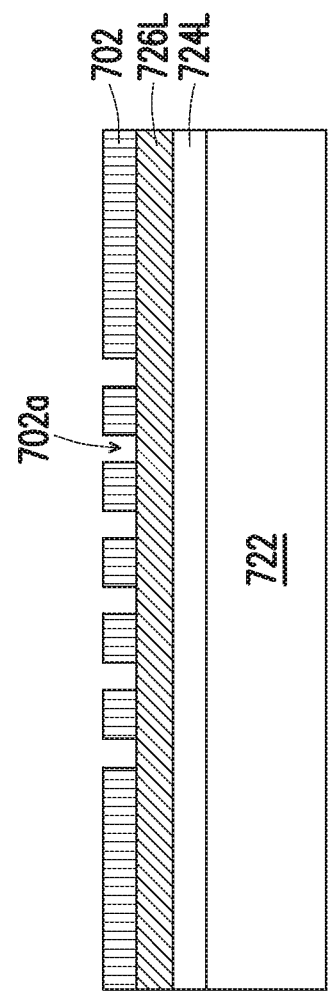
FIGS. 7 through 12 are cross-sectional views of a photomask assembly at various fabrication stages in accordance with some embodiments.

Referring to FIGS. 6 and 7, the method 600 includes operation 602 in which a first patterned resist layer 702 is formed over a mask blank including a substrate 722, a first layer 724L on the substrate 722 and a second layer 726L on the first layer 724L. The first layer 724L includes the same material used for the first patterned layer, as described above. The second layer 726L includes the same material used for the second patterned layer, as described above. The methods of forming the first layer 724L and the second layer 726L include chemical vapor deposition (CVD), physical vapor deposition (PVD), atomic layer deposition (ALD), plating, and/or other suitable processes. The first patterned resist layer 702 is formed by depositing a first resist layer (not shown) on the second layer 726L. In some embodiments, the first resist layer includes a positive-tone photoresist material, a negative-tone photoresist material or a hybrid-tone photoresist material. The first resist layer is formed by a deposition process such as, for example, spin coating. After forming the first resist layer, the first resist layer is subjected to a pattern of irradiation. Next, the exposed first resist layer is developed utilizing a conventional resist developer, forming the first patterned resist layer 702 having openings 702a therein.

Figure 8:
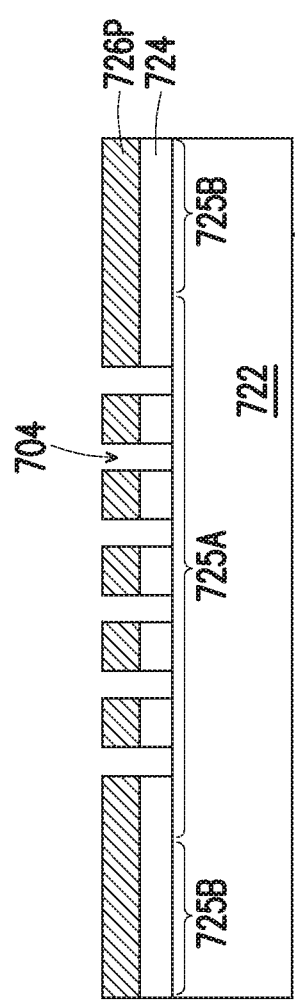

Referring to FIGS. 6 and 8, in operation 604 the first and second layers 724L, 726L are etched through the openings 702a of the first patterned resist layer 702 to form various openings 704 through the first and second layers 724L, 726L. The openings 704 exposes a top surface of the substrate 722. In some embodiments, the first and second layers 724L, 726L are etched using a single etching process. In some embodiments, the first and second layers 724L, 726L are etched in multiple distinct etching processes. In some embodiments, the etch is a dry etch such as, for example, reactive ion etching (RIE), a wet chemical etch or a combination thereof. After etching the first and the second layers 724L, 726L, the first patterned resist layer 702 is removed, for example, using wet stripping or plasma ashing. The etching of the first layer 724L and the second layer 726L provides the first patterned layer 724, as described above, and a second layer portion 726P which is a remaining portion of the second layer 726L after the etch. The first patterned layer 724 contains a pattern region 725A and a border region 725B surrounding the pattern region 725A.

Figure 9:
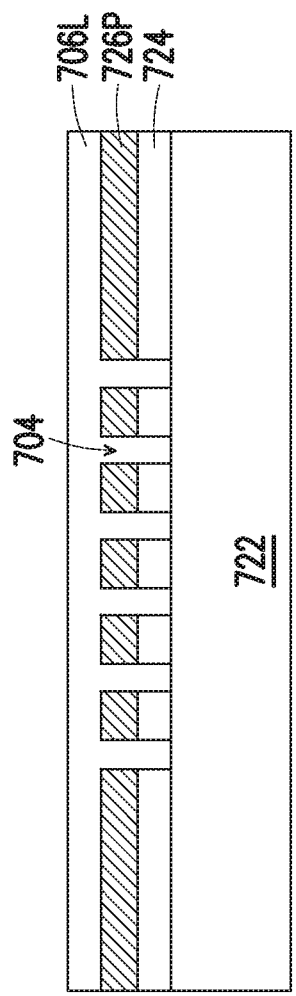

Referring to FIGS. 6 and 9, in operation 606 a second resist layer 706L is formed on the second layer portion 726P and on the substrate 722. The second resist layer 706L fills the openings 704. In some embodiments, the second resist layer 706L includes a same material as the first patterned resist layer 702 and is deposited, for example, by spin coating. In some embodiments, second resistlayer 706L includes a different material from the first patterned resist layer 702.

Figure 10B:
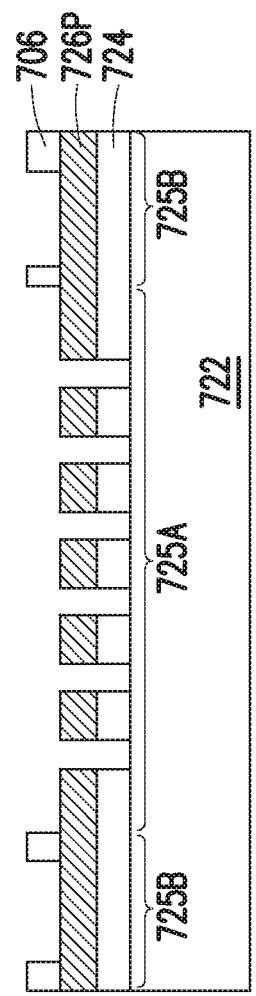

Referring to FIGS. 6, 10A and 10B, in operation 608 the second resist layer 706L is etched to expose portions of the second layer portion 726P in the pattern region 725A of the first patterned layer 724 (as in FIG. 10A) and in some embodiments, to expose portions of the second layer portion 726P in the pattern region 725A and at least a portion of the border region 725B of the first patterned layer 724 (as in FIG. 10B). A remaining portion of the second resist layer 706L constitutes a second patterned resist layer 706.

Figure 11A:
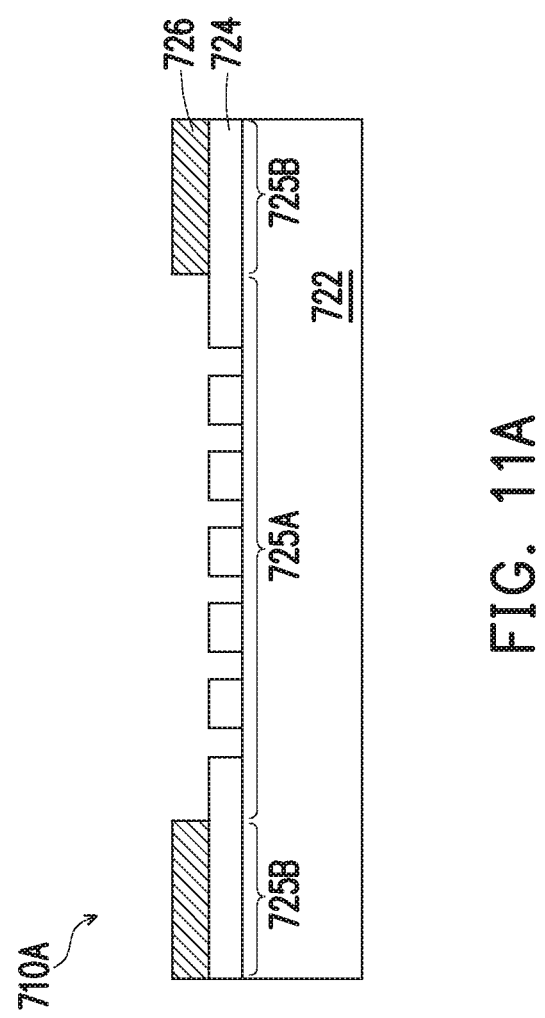
Figure 11B:
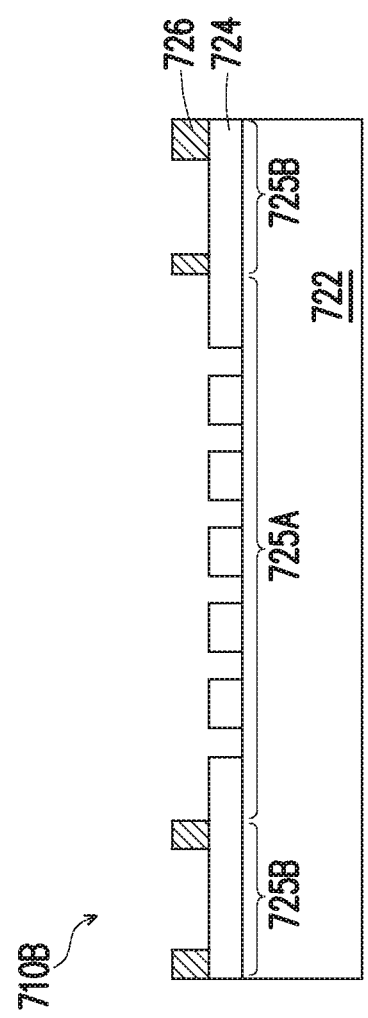

Referring to FIGS. 6, 11A and 11B, in operation 610 exposed portions of the second layer portion 726P are etched, thereby forming the second patterned layer 726, as described above. In some embodiments, an anisotropic etch such as, for example, RIE is performed to remove the portions of the second layer portion 726P that are not coved by the second patterned resist layer 706. After etching, the second patterned resist layer 706 is removed, for example, using wet stripping or plasma ashing. In some embodiments, as in FIG. 11A, in photomask 710A, the second patterned layer 726 covers the entire border region 725B of the first patterned layer 724. In some embodiments, as in FIG. 11B, in photomask 710B, the second patterned layer 726 is partially removed from the border region 725B of the first patterned layer 724, thereby exposing at least a portion of the border region 725B of the first patterned layer 724.

Figure 12:
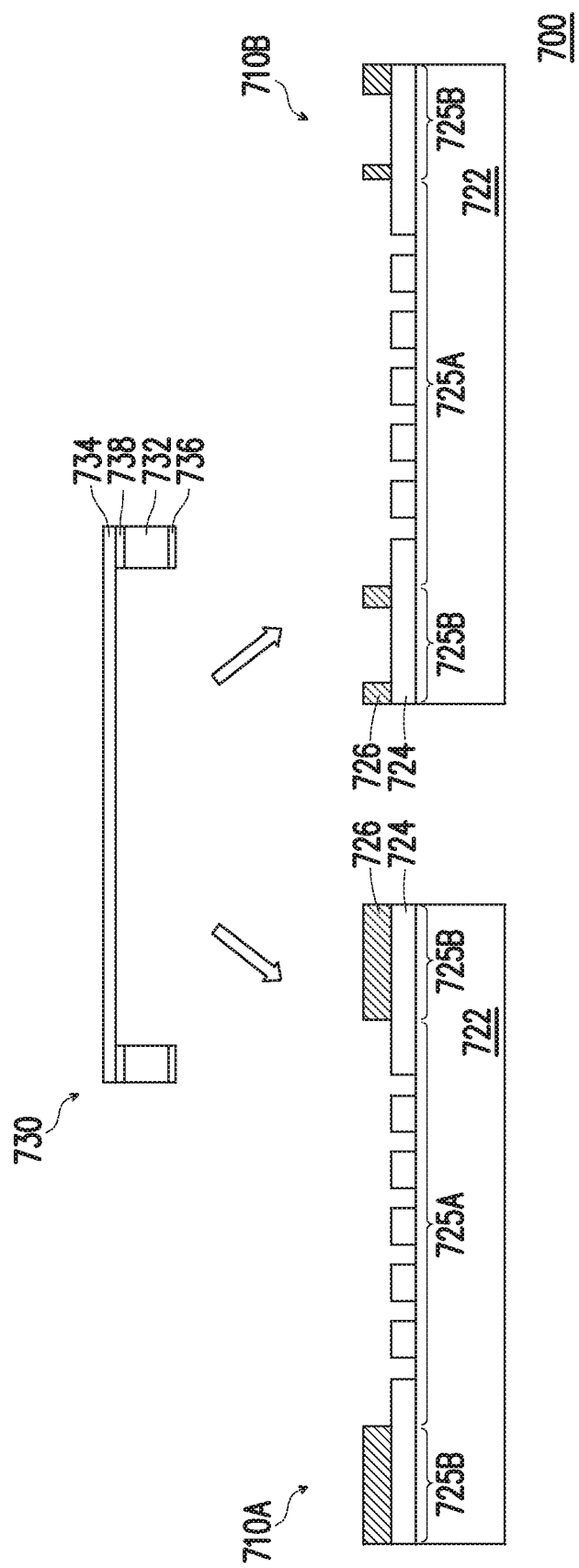

Referring to FIGS. 6 and 12, in operation 612 a pellicle 730, as described above, is attached to the photomask 710A or the photomask 710B by a frame adhesive 736, to form a corresponding photomask assembly. The pellicle 730 include a pellicle frame 732 and a pellicle membrane 734 attached to the pellicle frame 732 by a membrane adhesive 738. In instances where the second patterned layer 726 completely covers the border region 725B of the first patterned layer 724, an entire pellicle frame 732 is attached to the second patterned layer 726 in photomask 710A by the frame adhesive 736. In instances where a portion of the second patterned layer 726 is partially removed from the border region 725B of the first patterned layer 724, when attached, a first portion of the pellicle frame 732 is attached to the first patterned layer 724 at the border region 725B and a second portion of the pellicle frame 732 is attached to the second patterned layer 726 by the frame adhesive 736. In instances where a portion of the second patterned layer 726 is completely removed from the border region 725B of the first patterned layer 724, when attached, an entire pellicle frame 732 is attached to the first patterned layer 724 at its border region 725B by the frame adhesive 736.

One aspect of this description relates to a method of testing a photomask assembly. The method includes placing the photomask assembly into a chamber. The photomask assembly includes a pellicle attached to a first side of a photomask. The method further includes exposing the photomask assembly to a radiation source in the chamber. The exposing of the photomask assembly includes illuminating an entirety of an area of the photomask covered by the pellicle throughout an entire illumination time. In some embodiments, the exposing of the photomask assembly to the radiation source includes illuminating an entire area of the photomask. In some embodiments, the exposing of the photomask assembly includes illuminating the photomask assembly from the first side of the photomask. In some embodiments, the exposing of the photomask assembly includes illuminating the photomask assembly from a second side of the photomask opposite the first side. In some embodiments, the exposing of the photomask assembly includes setting a distance between the photomask assembly and the radiation source in a range from about 0.1 cm to about 30 cm. In some embodiments, the exposing of the photomask assembly includes exposing the photomask assembly to a VUV lamp. In some embodiments, the exposing of the photomask assembly includes directly illuminating the photomask assembly with the radiation source.

Another aspect of this description relates to a photomask assembly. The photomask assembly includes a photomask, and a pellicle mounted on the photomask. The photomask includes a first patterned layer on a substrate, and a second patterned layer on the first patterned layer. The first patterned layer includes a pattern region. The pellicle includes a pellicle frame attached to a first side of the photomask. At least a portion of the pellicle frame is attached directly to the first patterned layer. The pellicle further includes a pellicle membrane attached to the pellicle frame. The pellicle membrane extends over the pattern region. In some embodiments, the first patterned layer further includes a border region surrounding the pattern region, and the second patterned layer is on the border region. In some embodiments, an entirety of the pellicle frame is attached directly to the border region. In some embodiments, a first portion of the pellicle frame is attached directly to the border region, and a second portion of the pellicle frame is attached directly to the second patterned layer. In some embodiments, the first patterned layer includes MoSi. In some embodiments, the second patterned layer includes Cr. In some embodiments, the photomask is a transmissive photomask.

Still another aspect of this description relates to a method of testing a photomask assembly. The method includes placing the photomask assembly into a chamber. The photomask assembly includes a pellicle attached to a first side of a photomask. The photomask includes a first patterned layer on a substrate, and a second patterned layer on the first patterned layer. The pellicle includes a pellicle frame attached to the first side of the photomask by a frame adhesive. At least a portion of the pellicle frame is attached to the first patterned layer by the frame adhesive. The method further includes exposing the photomask assembly to a radiation source in the chamber. The exposing of the photomask assembly includes illuminating an entirety of an area of the photomask covered by the pellicle throughout an entire illumination time. In some embodiments, the exposing of the photomask assembly includes illuminating the photomask assembly from the first side of the photomask. In some embodiments, the exposing of the photomask assembly includes illuminating the photomask assembly from a second side of the photomask opposite the first side. In some embodiments, the exposing of the photomask assembly from the second side of the photomask includes illuminating at least a portion of the frame adhesive. In some embodiments, the exposing of the photomask assembly includes setting a distance between the photomask assembly and the radiation source in a range from about 0.1 centimeter (cm) to about 30 cm. In some embodiments, the exposing of the photomask assembly includes exposing the photomask assembly to a VUV lamp.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of testing a photomask assembly comprising:
placing the photomask assembly into a chamber, wherein the photomask assembly comprises a pellicle attached to a first side of a photomask;
exposing the photomask assembly to a radiation source having a wavelength ranging from about 160 nm to 180 nm in the chamber to accelerate haze development, wherein the exposing of the photomask assembly comprises illuminating an entirety of an area of the photomask covered by the pellicle throughout an entire illumination time and illuminating a frame adhesive attaching the pellicle to the photomask, the exposing of the photomask assembly comprises setting a distance between the photomask assembly and the radiation source in a range from about 0.1 centimeter (cm) to about 30 cm;

detecting haze of the photomask following exposing the photomask assembly to the radiation source; and predicting performance of the photomask assembly during a manufacturing process based on the detected haze of the photomask following exposing the photomask assembly to the radiation source.

2. The method of claim 1, wherein the exposing of the photomask assembly comprises illuminating an entire area of the photomask.

3. The method of claim 1, wherein the exposing of the photomask assembly comprises illuminating the photomask assembly from a second side of the photomask opposite the first side.

4. The method of claim 1, further comprising determining whether a material of the photomask is suitable for use as being employed as a mask blank based on the detected haze.

5. The method of claim 1, wherein the exposing of the photomask assembly comprises directly illuminating the photomask assembly with the radiation source.

6. A method of testing a photomask assembly comprising:
cleaning the photomask assembly using a cleaning solution;
placing the photomask assembly into a chamber, after the cleaning, wherein the photomask assembly comprises a pellicle attached to a first side of a photomask, the photomask comprising a first patterned layer on a substrate, and a second patterned layer on the first patterned layer, and the pellicle comprising a pellicle frame attached to the first side of the photomask by a frame adhesive, wherein at least a portion of the pellicle frame is directly attached to the first patterned layer by the frame adhesive;
exposing the photomask assembly to a radiation source in the chamber, wherein the exposing of the photomask assembly comprises illuminating an entirety of an area of the photomask covered by the pellicle throughout an entire illumination time wherein the exposing of the photomask assembly comprises illuminating the photomask assembly with a radiation having a wavelength ranging from about 160 nm to 180 nm;
performing an optical inspection of the photomask to detect for contaminants or precipitates following exposing the photomask assembly to the radiation source, wherein the optical inspection comprises detecting haze of the photomask;
determining whether the cleaning solution is suitable for use with the photomask assembly based on the optical inspection; and
predicting performance of the photomask assembly in a photolithography process in a manufacturing process based on result of the optical inspection.

7. The method of claim 6, wherein the exposing of the photomask assembly comprises illuminating the photomask assembly from the first side of the photomask.

8. The method of claim 6, wherein the exposing of the photomask assembly comprises illuminating the photomask assembly from a second side of the photomask opposite the first side.

9. The method of claim 8, wherein the exposing of the photomask assembly from the second side of the photomask comprises illuminating at least a portion of the frame adhesive.

10. The method of claim 6, wherein the exposing of the photomask assembly comprises setting a distance between the photomask assembly and the radiation source in a range from about 0.1 centimeter (cm) to about 30 cm.

11. A method of testing a photomask assembly comprising:
placing the photomask assembly into a chamber, wherein the photomask assembly comprises a pellicle attached to a first side of a photomask, the photomask comprising a first patterned layer on a substrate, and the pellicle comprising a pellicle frame directly attached to the first patterned layer by a frame adhesive;
exposing the photomask assembly to a radiation source having a wavelength ranging from about 160 nm to 180 nm in the chamber, wherein the exposing of the photomask assembly comprises illuminating an entirety of an area of the photomask covered by the pellicle throughout an entire illumination time;
removing the photomask from the chamber;
placing the photomask in an optical inspection tool;
performing an optical inspection of the photomask to detect for contaminants or precipitates following exposing the photomask assembly to the radiation source, wherein the optical inspection comprises detecting haze of the photomask; and
predicting performance of the photomask assembly in a photolithographic manufacturing process based on results of the optical inspection, wherein predicting the performance of the photomask assembly comprises determining whether materials of a photomask blank and a pellicle of the photomask assembly are suitable for forming the photomask assembly.

12. The method of claim 11, wherein the exposing of the photomask assembly comprises illuminating the photomask assembly from the first side of the photomask.

13. The method of claim 11, wherein the exposing of the photomask assembly comprises illuminating the photomask assembly from a second side of the photomask opposite the first side.

14. The method of claim 13, wherein the exposing of the photomask assembly from the second side of the photomask comprises illuminating at least a portion of the frame adhesive.

15. The method of claim 11, wherein the exposing of the photomask assembly comprises setting a distance between the photomask assembly and the radiation source in a range from about 0.1 centimeter (cm) to about 30 cm.

16. The method of claim 11, wherein a duration of exposing the photomask assembly is less than 10 minutes.

17. The method of claim 11, wherein the exposing the photomask assembly comprises illuminating the photomask assembly directly from the radiation source.

* * * * *